United States Patent
Yanai

[11] Patent Number: 5,942,931
[45] Date of Patent: Aug. 24, 1999

[54] CIRCUIT FOR PROTECTING AN IC FROM NOISE

[75] Inventor: Tetsuro Yanai, Tokyo, Japan

[73] Assignee: Oki Electric Industry Co., Ltd., Tokyo, Japan

[21] Appl. No.: 08/837,360

[22] Filed: Apr. 17, 1997

[30] Foreign Application Priority Data

Apr. 19, 1996 [JP] Japan .................................. 8-097843

[51] Int. Cl.⁶ .................................................. H03K 5/08
[52] U.S. Cl. .......................... 327/313; 327/314; 327/320; 327/328; 361/92
[58] Field of Search ..................................... 327/310, 313, 327/314, 320, 325, 327, 434, 436, 437, 328; 361/59, 92

[56] References Cited

U.S. PATENT DOCUMENTS

| | | | |
|---|---|---|---|
| 3,790,856 | 2/1974 | Hutchinson | 361/56 |
| 3,909,674 | 9/1975 | Spence et al. | |
| 3,916,263 | 10/1975 | Abbott | 361/91 |
| 4,808,839 | 2/1989 | Dunn et al. | 361/91 |
| 4,819,047 | 4/1989 | Gilfeather et al. | |
| 4,839,769 | 6/1989 | Soo et al. | 361/84 |
| 4,930,036 | 5/1990 | Stitch | |
| 4,937,700 | 6/1990 | Iwahashi | |
| 4,980,792 | 12/1990 | Kertis et al. | |
| 5,001,373 | 3/1991 | Bator et al. | 327/321 |
| 5,488,321 | 1/1996 | Johnson | 327/66 |

FOREIGN PATENT DOCUMENTS

| | | |
|---|---|---|
| 0 280 236 A2 | 8/1988 | European Pat. Off. |
| WO 95/19657 | 1/1995 | WIPO |

*Primary Examiner*—Terry D. Cunningham
*Attorney, Agent, or Firm*—Rabin & Champagne, P.C.

[57] ABSTRACT

A first MOS transistor (5) is provided between a power source terminal and an input terminal (3). A second MOS transistor (6) is provided between a ground terminal (2) and the input terminal (3). The gate of the first MOS transistor (5) is electrically connected to a node (8) and a resistor (9) is electrically connected between the node (8) and another ground terminal (2). The gate of the second transistor (6) is electrically connected to the ground terminal (2). When negative pulse-shaped static electricity is applied to a circuit constructed as described above, the potential applied to the gate of the first MOS transistor (5) is limited low by a voltage drop developed across the resistor (9). Therefore, the current flowing between the source and drain of the first MOS transistor (5) can be controlled low and a substrate current produced due to impact ionization can be prevented from flowing. It is thus possible to obtain a stabler operation of a semiconductor integrated circuit device.

14 Claims, 2 Drawing Sheets

CIRCUIT FOR PROTECTING AN IC FROM NOISE

BACKGROUND OF THE INVENTION

1. Field of the Invention

This invention relates to a semiconductor integrated circuit device, and particularly to a protection circuit for providing protection against noise such as static electricity or the like applied to an input terminal or an output terminal of an integrated circuit device.

2. Description of the Related Art

In a conventional protection circuit for providing protection against the input of noise such as static electricity or the like, the source of a protective N channel MOS transistor (hereinafter abbreviated merely as "NMOS transistor") is electrically connected to an input terminal, the drain thereof is electrically connected to a power source terminal and the gate thereof is electrically connected to a ground terminal. The conventional protection circuit protects an internal circuit against the noise, using a breakdown in the NMOS transistor.

When positive pulse-shaped voltage noise (e.g., 1000V) is applied to the input terminal through an external pad due to static electricity or the like, the protective NMOS transistor breaks down. Thus, current flows from the source thereof electrically connected to the input terminal to the drain thereof electrically connected to the power source terminal. Namely, since the noise is discharged from the input terminal to the power source terminal, the internal circuit is protected from the noise.

On the other hand, when negative voltage noise (e.g., −1000V) is applied to the input terminal due to the static electricity or the like, the protective NMOS transistor is turned ON. As a result, current is produced and flows from the drain thereof electrically connected to the power source terminal of the protective NMOS transistor to the source thereof electrically connected to the input terminal. Therefore, since the noise is substantially discharged from the input terminal to the power source terminal, the internal circuit is protected from the noise.

When a negative voltage exceeding the threshold value of the protective NMOS transistor is applied to the input terminal in the conventional protection circuit, a current flows from the power source terminal of the corresponding integrated circuit device to the input terminal thereof. At this time, the neighborhood of the drain of the protective NMOS transistor is brought to a high electric field. Hot electrons produced due to the high electric field will cause impact ionization, thereby allowing a substrate current to flow between the drain thereof and a substrate. As a result, the potential applied to the substrate of the integrated circuit device increases. This will cause interference with the stable operation of the integrated circuit device. Therefore, improvements in this point have been desired.

SUMMARY OF THE INVENTION

With the foregoing in view, it is an objective of the present invention to provide a protection circuit capable of obtaining a more stable operation of an integrated circuit device.

According to one aspect of the present invention, for achieving the above objective, there is provided a protection circuit as a typical example, comprising:

a first field effect transistor having one electrode electrically connected to a first power source terminal having a first potential, the other electrode electrically connected to a pad and a gate electrically connected to a first node;

an element electrically connected between the first node and the pad and forming a current path extending from the first node to the pad when a negative potential lower than a predetermined value is applied to the pad; and resistance means provided between the first node and a second power source terminal having a second potential.

A typical ones of various inventions disclosed in the present application has been described in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
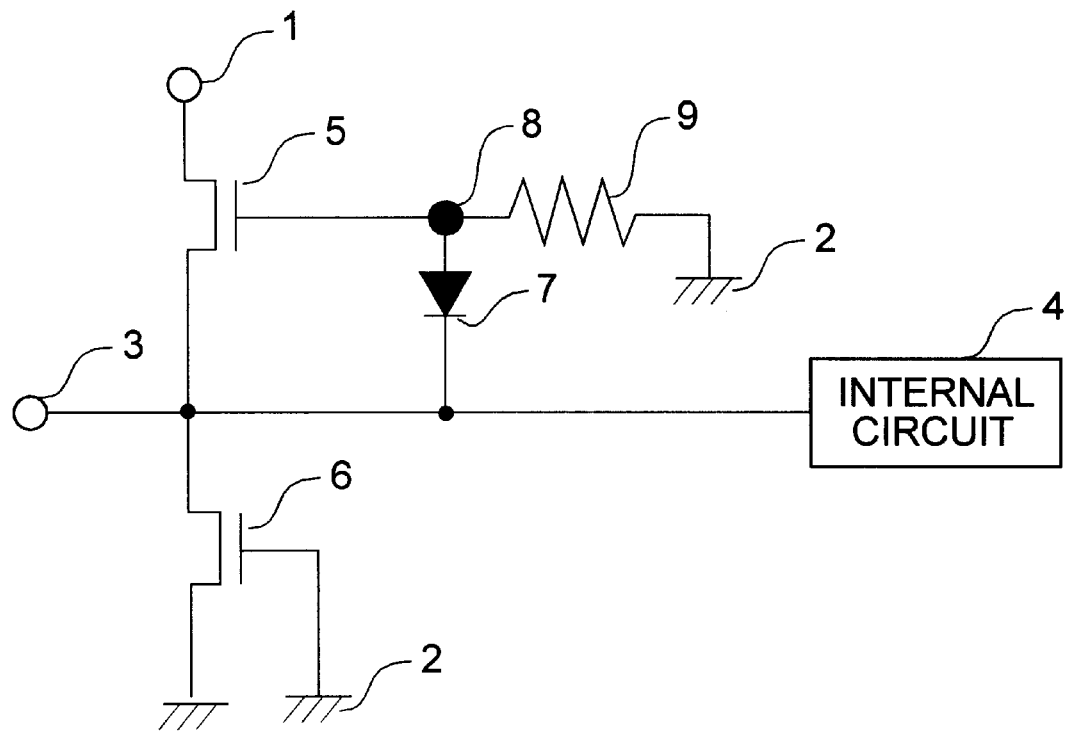
FIG. 1 is a circuit diagram showing a first embodiment of the present invention.

FIG. 1 is a circuit diagram showing a first embodiment of the present invention. As shown in FIG. 1, the source of an NMOS transistor 5 is electrically connected to an input terminal 3, whereas the drain thereof is electrically connected to a power source terminal 1. The power source terminal 1 is supplied with a power source potential of 5V. The source of an NMOS transistor 6 is electrically connected to a ground terminal 2, whereas the drain thereof is electrically connected to the input terminal 3. The ground terminal 2 is supplied with a potential of 0V. Further, the input terminal 3 is electrically connected to an unillustrated external pad. These NMOS transistors 5 and 6 serve as protective NMOS transistors for protecting an internal circuit 4 from noise such as static electricity or the like. The gate of the NMOS transistor 5 is electrically connected to a node 8. A diode 7 is provided between the node 8 and the input terminal 3. Further, a resistor 9 is provided between the node 8 and the ground terminal 2.

When a high-level signal (e.g., 5V) is inputted to the input terminal 3 of the present circuit during the normal operation, the NMOS transistors 5 and 6 do not break down. Accordingly, the high-level signal is transferred to the internal circuit 4 as it is. On the other hand, when the input terminal 3 is supplied with a low-level signal (e.g., 0V), the NMOS transistors 5 and 6 are not turned ON. Accordingly, the low-level signal is also transferred to the internal circuit 4 as it is.

Thus, if the signal applied to the input terminal 3 is about 0 to 5V for activating the internal circuit 4, then the protective transistors 5 and 6 contribute nothing to the normal operation.

When pulse-shaped positive voltage noise (e.g., 1000V) is applied to the input terminal 3 due to the static electricity or the like, the present circuit performs a protecting operation. Namely, when a voltage more than the voltage for bringing the NMOS transistors 5 and 6 to the electrical breakdown is applied to the input terminal 3, the NMOS transistors 5 and 6 break down so that a current flows from the sources thereof to the drains thereof. Therefore, current flows from the input terminal 3 to the power source terminal 1 and from the input terminal 3 to the ground terminal 2, respectively. The positive voltage noise is discharged into the power source terminal 1 and the ground terminal 2 via the current flow so that the internal circuit 4 is protected therefrom.

Next, when a negative voltage noise (e.g., −1000V) is applied to the input terminal 3 of the present circuit, the NMOS transistors 5 and 6 are turned ON. At this time, current flows from the power source terminal 1 to the input terminal 3 through the NMOS transistor 5, from the ground terminal 2 to the input terminal 3 through the NMOS transistor 6, and from the ground terminal 2 to the input terminal 3 through the resistor 9 and the diode 7.

Since the current flows from each of the power source terminal 1 and the ground terminals 2 to the input terminal 3, the noise is substantially discharged into the power source terminal 1 and the ground terminals 2. As a result, the internal circuit 4 is protected against the noise.

At this time, the current that flows from the ground terminal 2 to the node 8, is less reduced or limited low by the resistor 9. Since the potential applied to the gate of the NMOS transistor 5 is identical to the potential at the node 8, the potential applied to the gate thereof is lowered due to a voltage drop developed across the resistor 9. The current that flows between the source and drain of the NMOS transistor 5, is thus limited by the reduction in the gate potential. Accordingly, the selection of a suitable value of the resistor 9 can provide a reduction in the potential of the gate of the NMOS transistor 5 and a reduction in substrate current produced from the NMOS transistor 5 due to impact ionization. It is thus possible to obtain a stable operation of an integrated circuit device.

Figure 2:
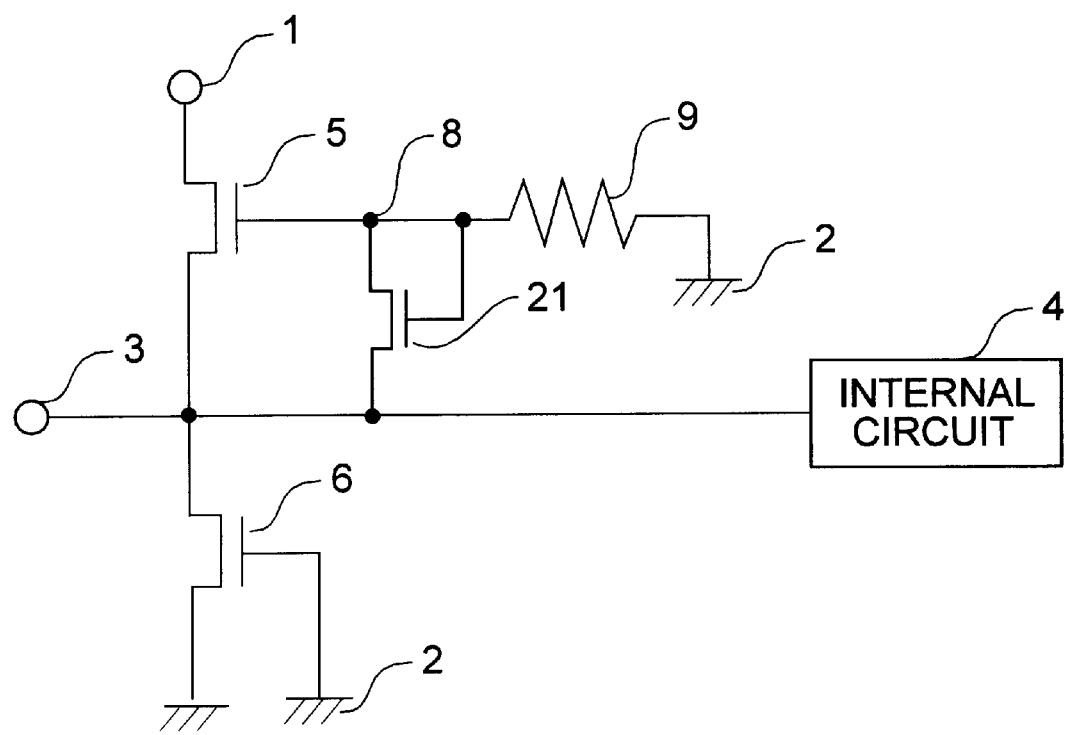
FIG. 2 is a circuit diagram illustrating a second and third embodiment of the present invention.

FIG. 2 is a circuit diagram showing a semiconductor integrated circuit device according to a second embodiment of the present invention. Incidentally, parts common to those employed in the first embodiment are identified by the same reference numerals.

The present embodiment is characterized in that a third NMOS transistor 21 is provided between a first node 8 and an input terminal 3 and the gate of the third NMOS transistor 21 is electrically connected to the first node 8.

The normal operation of its operation upon present circuit and the application of positive pulse-shaped voltage noise (e.g., 1000V) to an input terminal 3 due to static electricity or the like, are similar to that provided by the first embodiment.

Next, when negative voltage noise (e.g., −1000V) is applied to the input terminal 3 of the present circuit due to static electricity or the like, NMOS transistors 5 and 6 and the third NMOS transistor 21 are turned ON. At this time, current flows from a power source terminal 1 to the input terminal 3 through the NMOS transistor 5. Further, current flows from a ground terminal 2 to the input terminal 3 through the NMOS transistor 6. Moreover, current flows from another ground terminal 2 to the input terminal 3 through a resistor 9 and the third NMOS transistor 21.

Since the current flows from each of the power source terminal 1 and the ground terminals 2 to the input terminal 3, the negative voltage noise is substantially discharged into the power source terminal 1 and the ground terminals 2. Accordingly, the internal circuit 4 is protected from the negative voltage noise.

Incidentally, the function of limiting low the potential applied to the gate of the NMOS transistor 5 of the above operation is similar that performed by the first embodiment.

The diode and the NMOS transistor must be normally fabricated in another process to manufacture an IC. However, the replacement of the diode by the NMOS transistor 21 in the above-described manner can eliminate a diode fabrication process step in the manufacturing process. Namely, three NMOS transistors may be fabricated in the same process. As a result, the manufacturing process is simplified and hence the protection circuit according to the present invention can be manufactured at lower cost.

As a third embodiment of the present invention, the threshold value of the NMOS transistor 21 employed in the second embodiment is set to a threshold value lower than that of the NMOS transistor 5.

The normal operation of the present circuit and the application of positive pulse-shaped voltage noise (e.g., 1000V) to an input terminal 3 due to static electricity or the like are similar to that provided by the first embodiment.

Next, when negative voltage noise (e.g., −1000V) is applied to the input terminal 3 in the present circuit due to static electricity or the like, NMOS transistors 5, 6 and 21 are turned ON. At this time, current flows from a power source terminal 1 to the input terminal 3 through the NMOS transistor 5. Further, current flows from a ground terminal 2 to the input terminal 3 through the NMOS transistor 6. Moreover, current flows from another ground terminal 2 to the input terminal 3 through a resistor 9 and the NMOS transistor 21.

Since the current flows from each of the power source terminal 1 and the ground terminals 2 to the input terminal 3, the negative voltage noise is substantially discharged into the power source terminal 1 and the ground terminals 2. As a result, an internal circuit 4 is protected from noise, such as static electricity or the like.

If the difference in potential between the node 8 and the input terminal 3 becomes equal to the threshold value of the NMOS transistor 21 at this time, then the NMOS transistor 21 is brought into an ON state. Thus, the potential at the node 8, i.e., the potential applied to the gate electrode of the NMOS transistor 5 reaches a value near the threshold value of the NMOS transistor 21. As a result, the potential applied to the gate electrode of the protective NMOS transistor 5 is fixed to a potential near the threshold value of the NMOS transistor 21. Therefore, the gate potential of the NMOS transistor 5 can be limited to a potential lower than the gate potential of the NMOS transistor 5 employed in the second embodiment. Namely, the current that flows between the source and drain of the NMOS transistor 5, can be further reduced or limited as compared with the second embodiment. Thus, since a substrate current produced from the NMOS transistor 5 due to impact ionization can be further limited, a more excellent protection circuit can be fabricated.

Figure 3:
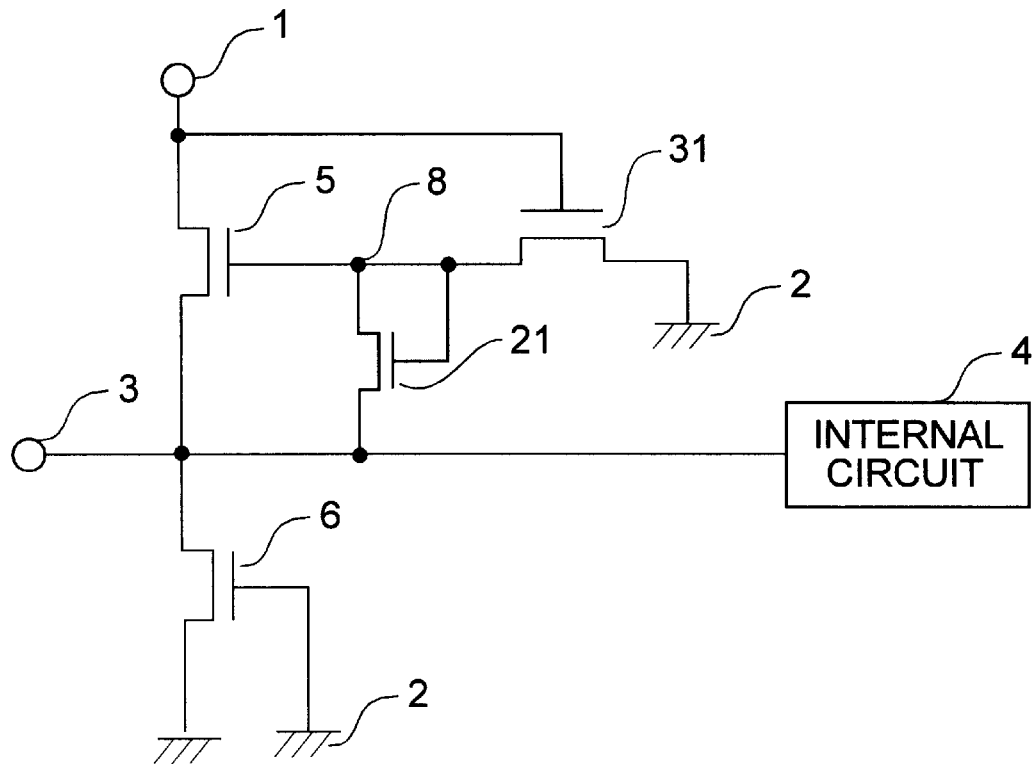
FIG. 3 is a circuit diagram depicting a fourth embodiment of the present invention.

FIG. 3 is a circuit diagram illustrating a fourth embodiment of the present invention. Portions common to those employed in the first and second embodiments are identified by the same reference numerals. The present embodiment is characterized in that the resistor 9 employed in the first embodiment is replaced by a fourth NMOS transistor 31. The gate electrode of the fourth NMOS transistor 31 is electrically connected to a power source terminal 1.

Accordingly, the NMOS transistor 31 is held ON at all times. An on resistance of the NMOS transistor 31 is used as a resistance means.

The normal operation of the present circuit and the application of positive pulse-shaped voltage noise (e.g., 1000V) to an input terminal 3 due to static electricity or the like, are similar to that provided by the first embodiment.

Next, when negative voltage noise (e.g., -1000V) is applied to the input terminal 3 in the present circuit, NMOS transistors 5, 6 and 21 are respectively brought to an ON state. At this time, current that flows from a ground terminal 2 to the input terminal 3 through the NMOS transistor 6, is produced. Further, current flows from another ground terminal 2 to the input terminal 3 through the NMOS transistor 31 and the NMOS transistor 21. Moreover, a current flows from the power source terminal 1 to the input terminal 3 through the NMOS transistor 5.

Since the current flows from each of the power source terminal 1 and the ground terminals 2 to the input terminal 3, the negative voltage noise is substantially discharged into the power source terminal 1 and the ground terminals 2. As a result, the internal circuit 4 is protected from the negative voltage noise.

Since the field effect NMOS transistor normally has a resistance value of about a few kilohms when it is an ON state, the NMOS transistor 31 serves as a resistance means and hence the current that flows from the ground terminal 2 to a node 8, is limited low by the NMOS transistor 31. Further, since the potential applied to the gate electrode of the NMOS transistor 5 is reduced by a voltage drop developed in the NMOS transistor 31, current that flows between the source and drain of the NMOS transistor 5, is also limited.

Since the resistive element is fabricated in a process different from that for the NMOS transistor, the replacement of the resistive element by the NMOS transistor permits deletion of a resistive-element fabrication process upon manufacturing an integrated circuit device. As a result, an advantage can be brought about that the manufacturing process can be simplified and the integrated circuit device can be manufactured at a lower cost.

The fabrication of a resistive element of a few kilohms using a polysilicon interconnection or the like needs a few-mm interconnection. Since, however, the NMOS transistor serves as a resistance means when in an ON state and normally has a resistance value of a few kilohms, a greater resistance value can be obtained with a smaller area. Therefore, an advantageous effect is also obtained that the area of the resistive element can be reduced.

Figure 4:
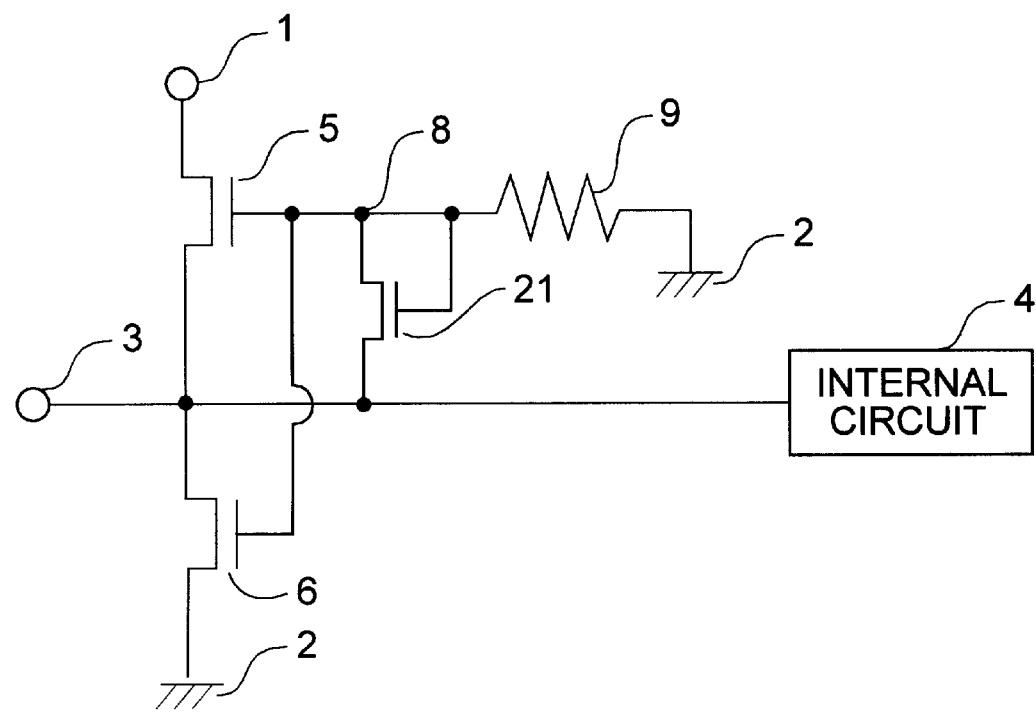
FIG. 4 is a circuit diagram showing a fifth embodiment of the present invention.

FIG. 4 is a circuit diagram showing a fifth embodiment of the present invention. Parts common to those employed in the first and second embodiments are identified by like reference numerals. The present embodiment is characterized in that the gate of an NMOS transistor 6 is electrically connected to a node 8.

The normal operation of the present circuit and the application of positive pulse-shaped voltage noise (e.g., 1000V) to an input terminal 3 due to static electricity or the like are similar to that provided by the first embodiment.

Next, when negative voltage noise (e.g., -1000V) is applied to the input terminal 3 of the present circuit, NMOS transistors 5 and 6 are turned ON. At this time, current flows from a power source terminal 1 to the input terminal 3 through the NMOS transistor 5. Further, current flows from a ground terminal 2 to the input terminal 3 through the NMOS transistor 6. Moreover, a current flows from another ground terminal 2 to the input terminal 3 through a resistor 9 and an NMOS transistor 21.

Since the current flows from the power source terminal 1 and the ground terminals 2 to the input terminal 3, the negative voltage noise is substantially discharged into the power source terminal 1 and the ground terminals 2. As a result, the internal circuit 4 is protected from static electricity.

At this time, the current flowing from the ground terminal 2 to the node 8 is limited by the resistor 9. Since the potentials applied to the gates of the NMOS transistors 5 and 6 are identical to the potential at the node 8, the gate potentials of the NMOS transistors 5 and 6 are limited by a voltage drop developed across the resistor 9. As a result, the current that flows between the source and drain of each of the NMOS transistors 5 and 6, is also limited.

Such connections can limit the flow of a substrate current produced from the NMOS transistor 6 electrically connected between the ground terminal 2 and the input terminal 3 as well as the flow of a substrate current produced from the NMOS transistor 5. Since the effect of limiting the flow of the substrate current produced from both protective transistors on the ground and source sides can be obtained, a stable operation of an integrated circuit device can be achieved.

Although the present invention has been described as the protection circuit relative to the input terminal in the present embodiment, the present invention is not necessarily limited to the use of the input terminal. The present invention can be also utilized as the protection circuit relative to an output terminal.

According to a typical one of the semiconductor integrated circuit devices of the present invention, as has been described above, an element for forming a current path extending from a first node to a pad is provided between the first node and the pad, and a resistance means is provided between the first node and a second power source. Owing to the provision of these components, the application of the voltage to the gates of the protective transistors and the flow of the current into the protective transistors can be limited. Namely, since the flow of the substrate current produced in the transistors can be restricted, a semiconductor integrated circuit device is provided which is capable of obtaining a stabler operation thereof while the function of providing protection against an internal circuit is being held in the same manner as the prior art.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A protection circuit comprising:
   a first field effect transistor having one electrode electrically connected to a first power source terminal having a first potential, the other electrode electrically connected to a pad and a gate electrically connected to a first node;
   an element electrically connected between the first node and the pad and forming a current path extending from the first node to the pad;
   a second field effect transistor having one electrode electrically connected to the pad, the other electrode electrically connected to a second power source terminal having a second potential and a gate electrically connected to the first node; and resistance means provided between the first node and the second power source terminal.

2. A protection circuit as claimed in claim 1, wherein said element is a diode.

3. A protection circuit as claimed in claim 1, wherein said element is a third field effect transistor.

4. A protection circuit as claimed in claim 3, wherein a threshold value of the third field effect transistor is set to a value lower than a threshold value of the first field effect transistor.

5. A protection circuit as claimed in claim 1, wherein said resistance means is a third field effect transistor.

6. A protection circuit as claimed in claim 5, wherein the third field effect transistor has a first electrode that is electrically connected to the first node, a second electrode that is electrically connected to the second power source terminal, and a gate that is electrically connected to the first power source terminal.

7. A protection circuit as claimed in claim 1, wherein the resistive means reduces the potential at the second power source terminal that is applied to the gate electrode of the first field effect transistor.

8. A protection circuit comprising:

a first field effect transistor having one electrode electrically connected to a first power source terminal having a first potential, the other electrode electrically connected to a pad, and a gate electrically connected to a first node;

an element electrically connected between the first node and the pad and forming a current path extending from the first node to the pad;

a second field effect transistor having one electrode electrically connected to the pad, the other electrode electrically connected to a second power source terminal having a second potential, and a gate electrically connected to the second power source terminal; and resistance means provided between the first node and the second power source terminal.

9. A protection circuit as claimed in claim 8, wherein said element is a diode.

10. A protection circuit as claimed in claim 8, wherein said element is a third field effect transistor.

11. A protection circuit as claimed in claim 10, wherein a threshold value of the third field effect transistor is set to a value lower than a threshold value of the first field effect transistor.

12. A protection circuit as claimed in claim 8, wherein said resistance means is a third field effect transistor.

13. A protection circuit as claimed in claim 12, wherein the third' field effect transistor has a first electrode that is electrically connected to the first node, a second electrode that is electrically connected to the second power source terminal, and gate that is electrically connected to the first power source terminal.

14. A protection circuit as claimed in claim 8, wherein the resistive means reduces the potential at the second power source terminal that is applied to the gate electrode of the first field effect transistor.

* * * * *